United States Patent Office 3,567,453

Patented Mar. 2, 1971

3,567,453

LIGHT SENSITIVE COMPOSITIONS FOR PHOTORESISTS AND LITHOGRAPHY

Douglas G. Borden, Rochester, N.Y., assignor to Eastman Kodak Company, Rochester, N.Y.

No Drawing. Filed Dec. 26, 1967, Ser. No. 693,168

Int. Cl. G03c *1/54, 1/94*

U.S. Cl. 96—91 12 Claims

ABSTRACT OF THE DISCLOSURE

A radiation sensitive compound comprises a tetrasubstituted borate anion and an organic cation containing an atom selected from the group consisting of nitrogen, arsenic, tin, antimony, sulfur, iodine, phosphorus, oxygen, titanium, palladium, chromium and cobalt. These compounds can be spectrally sensitized and can be used in photoresists and for lithography.

This invention relates to photochemical reproduction methods and materials and more particularly to radiation sensitive layers, the solubilities of which are differentially modified in accordance with their exposure to radiation.

It is known in the photographic art to prepare printing plates and stencils by processes which involve as essential features the imagewise exposure of a coating of a radiation sensitive material, the solubility of which is differentially modified by the action of radiation and subsequent treatment of the coating with a solvent or solvent system which preferentially removes portions of the coating in accordance with their exposure to light. Processes in which the exposed materials are preferentially removed to afford a duplicate of the pattern through which they were exposed are termed positive working and processes in which the unexposed materials are preferentially removed are termed negative working. Many such processes are known in the art, notable among which are those which employ as light sensitive materials bichromated colloids, light sensitive resins and diazo compounds. However, many of these light sensitive compounds, such as diazo compounds, cannot be spectrally sensitized. Therefore, it has been desirable to have light sensitive materials which could be sensitized to light of various wavelengths.

It is an object of this invention to provide radiation sensitive elements employing tetra-substituted borate salts of organic cations, the solubilities of which are differentially modified in accordance with their exposure to radiation. It is another object of this invention to provide photographic layers comprising radiation sensitive materials which are tetra-substituted borates. It is still another object to provide photographic elements comprising a support with a layer thereon comprising at least one tetra-substituted borate radiation sensitive material. It is still another object to improve the performance of certain radiation sensitive materials which are, themselves, useful for the preparation of negative working lithographic plates or resist images. It is another object to provide photographic layers for lithographic plates comprised of water insoluble salts or complexes of azonia diazo ketones. Another object is to show that the borate salts of many diazonium compounds may be sensitized so as to increase the effective rate of photodecomposition and to increase their spectral response. Still another object is to show that polymeric diazonium organo borate salts may be spectrally sensitized. A still further object is to show that many simple and complex borate salts of S, O, P, N, I, Co, As, Sb, Sn, Ti, Pd and Cr compounds are radiation sensitive and can be sensitized in image forming photochemical reactions. A further object is to provide certain radiation sensitive products which can be spectrally sensitized at least to 500 mμ.

I have found that compounds, the solubilities of which are differentially modified by the action of light, are provided by salts comprising a tetra-substituted borate anion such as, for example, a tetraphenyl borate anion and an organic cation containing an atom selected from the group consisting of nitrogen, sulfur, oxygen, iodine, phosphorus, titanium, cobalt, arsenic, tin, palladium, chromium and antimony. Spiro-borates or biscyclic borates such as, e.g. bis-2,2′-biphenylene borate, are particularly stable and are similarly useful to react with the above organic cations. This discovery has provided us with materials for preparing light sensitive layers which, in conjunction with solvent development, provide both positive working and negative working layers.

The borate reaction products of this invention may be referred to herein as organic borate salts. The term "salts" as used herein, is intended to include tetra-substituted borates or their reaction products which may be complexes, etc. Such materials are characterized by being water insoluble and usually more oleophilic and less soluble in polar solvents, such as alcohols, e.g. methyl, ethyl, etc. than the organic compounds from which they are obtained. Furthermore, in the absence of other competing light sensitive groups in the molecule, the compounds of this invention tend to become more soluble in these solvents on exposure to light. If light sensitive groupings are also present in the molecule or if the organo borate salt is coated along with another light sensitive material, the mechanism becomes more complex.

For the purpose of explaining my invention, light sensitive coatings which change solubility characteristics on exposure to light may be divided arbitrarily into two categories:

(1) Coatings wherein a large number of light sensitive groupings per unit area must be modified by exposure to light to effect an appreciable change in solubility characteristics and (2) Coatings wherein only a relatively small number of light sensitive groupings per unit area must be modified by the light exposure to effect an appreciable change in solubility characteristics. Coatings representative of category (1) include such materials as the organo borate salts of this invention which do not contain other light sensitive groups, e.g. o-quinone diazides, simple diazonium salts, etc., wherein for solubility to be appreciably changed, a large number of light sensitive groups per unit area must be modified. Coatings representative of category (2) include such materials as light sensitive polymers which are insolubilized by the formation of relatively few cross-links per unit area and polymers which are sensitized with materials which on exposure to light produce the requisite cross-links. Assuming that the quantum efficiency of the respective light sensitive groupings of both categories are approximately equal, it can be seen that the coatings of category (2) will have significantly higher photographic speeds than coatings of category (1). It can also be seen that, all other things being equal, and there being no interaction between the materials, if materials of categories (1) and (2) are coated together, the results due to category (2) will prevail and the coating will be insolubilized by exposure to light even though the material from category (1) may photoreact competitively to tend to confer solubility on the exposed areas of the coating. It follows that a similar result will be obtained from a coating of a single material having the characteristics of both categories (1) and (2).

This explanation is inserted herein to explain the fact that the organo borate salts of my invention may be either positive or negative working depending upon the environment in which they are employed. They may be employed separately in molecules as positive working moieties, or they may be employed as integral parts of molecules containing other positive working moieties to confer oleophilicity and reduced solubility on the unexposed materials without adversely affecting the positive working nature of the materials. Conversely, they may be employed as integral parts of molecules which contain negative working moieties in which case either negative or positive working materials may be obtained depending on whether the negative or positive working moieties present are photographically more efficient in modifying the solubility characteristics of the material and depending on the ratio of positive to negative working groups present.

It follows from this explanation that whether a particular molecule containing one or more of the organo borate anions of our invention is negative or positive working will depend upon the constitution of the entire molecule and its environment. It also follows from this explanation that certain compounds containing simple positively charged groups of the type described above which heretofore were known to undergo changes in solubility on exposure to light but were of little utility because of hydrophilicity or high solubility in polar solvents may be made useful by the practice of my invention. Moreover, the organo borate salts of my invention may be sensitized by the addition of small amounts of various compounds so that their effective rate of photochemical reaction may be increased as much as ten times and their spectral response may be extended to wavelengths in some instances of at least 500 m$\mu$.

The radiation sensitive salts comprising a tetra-substituted borate anion and an organic cation are prepared most readily by the direct reaction, in an appropriate solvent, of an alkali metal polyaryl borate with an organic compound containing a cation containing an atom selected from the group consisting of a nitrogen atom, a sulfur atom, an oxygen atom, an iodine atom, a phosphorus atom, a titanium atom, a cobalt atom, an arsenic atom, a tin atom, a palladium atom, a chromium atom and an antimony atom. These radiation sensitive organo borate salts can be represented by the structural formula $$\left[ R_1-\underset{R_4}{\overset{R_2}{B}}-R_3 \right]^{\ominus} X^{\oplus}$$

wherein $R_1$ is an aryl radical; each of $R_2$, $R_3$, and $R_4$ is selected from the group consisting of aryl, lower alkyl, aralkyl, cyano and lower alkenyl radicals; any two of the $R_1$, $R_2$, $R_3$, and $R_4$ radicals taken together can represent an arylene radical; and $X^{\oplus}$ is an organic cation containing an atom selected from the group consisting of nitrogen, arsenic, tin, antimony, sulfur, iodine, phosphorus, oxygen, titanium, palladium, chromium, and cobalt. The reaction may be effected in a solvent in which the reaction product is insoluble and the product isolated for subsequent use or, alternatively, a reaction solvent may be used which is a common solvent for both the reactants and the radiation sensitive product, the resulting solution being used directly in the preparation of photographic layers. The reaction usually proceeds at room temperature; however, temperatures of from 50–100° C. may be employed. Completion of the reaction may be determined by dropping an aliquot of the reaction mixture into water to precipitate the water insoluble product.

Parent salts from which the described radiation sensitive organo borate salts of my invention can be prepared include virtually all organic compounds which contain a cation of the type described hereinabove. It is to be understood that such compounds may contain other groupings which may be radiation sensitive or contain a multiplicity of or a combination of such groupings. Furthermore, it should be understood that said parent organic compounds may be either monomeric or polymeric in nature.

Specific classes of organic compounds found to be useful in the practice of my invention include heterocyclic compounds containing a cation of the type described above, aliphatic compounds containing alkyl and aralkyl radicals and one of the cations described above, carbocyclic compounds having positively charged atoms of the type described above attached directly to the carbocyclic ring or through an intervening atom or group of atoms and polymeric compounds containing a multiplicity of one or more of the positively charged atoms described above. Organic compounds such as amines, ethers, hydrazines, etc., which do not contain positively charged atoms of the type described above may be made useful in the practice of my invention simply by treating them with an acid to obtain the corresponding ammonium salt, oxonium salt, etc., and then treating them with a tetra-substituted borate as described herein. The organic compound must be capable of solution in a solvent, such as an organic solvent, water, etc. Typical solvents include, e.g. dimethyl formamide, dimethyl sulfoxide, alcohols, ketones, etc.

The tetra-substituted borate anions employed in this invention are those which form radiation sensitive oleophilic organic salts which are insoluble in the developing solvent employed such as water, isopropyl alcohol or the like which organic salts decompose on exposure to light to form developer solvent soluble species in the exposed areas.

Typical tetra-substituted borates useful in the practice of this invention include triaryl borates, tetraaryl borates, bisarylene borates, etc. having the structure:

$$\left[ R_1-\underset{R_4}{\overset{R_2}{B}}-R_3 \right]^{\ominus} Z^{\oplus}$$

wherein $R_1$ is an aryl radical; $R_2$, $R_3$ and $R_4$ are each selected from the group consisting of aryl, lower alkyl (preferably 1–6 carbon atoms), lower aralkyl (preferably 1–6 carbon atoms in the alkyl chain), cyano and lower alkenyl radicals; and any two of the $R_1$, $R_2$, $R_3$ and $R_4$ radicals taken together represent an arylene radical, including polycyclic arylene as exemplified by 2,2′-biphenylene. Z is a cation such as, e.g. sodium, lithium, potassium, etc.

The term "aryl" is intended to mean monocyclic aryl such as phenyl, tolyl, p-dimethylaminophenyl, 4-biphenylyl, mesityl, 4-stilbenyl, 4-styryl, cyclopentadienyl, cyclohexadienyl and the like; polycyclic aryl such as 1-naphthyl, 2-naphthyl, anthranyl, and the like; as well as heterocyclic aryl such as 2-thienyl, 2-furyl, 2-pyrrolyl, and the like.

Alkenyl groups which $R_2$, $R_3$ and $R_4$ may represent are preferably lower alkenyl radicals having 1 to 6 carbon atoms and an unsaturated linkage to at least one of the $\alpha$ and $\beta$ carbon atoms thereof, for example, vinyl, allyl, butadienyl and the like.

Typical substituents on the aromatic groups include hydrogen, alkyl $C_1$ to $C_{10}$, alkoxy $C_1$ to $C_{10}$, thioalkyl $C_1$ to $C_{10}$, halogens, acetal, hemiacetal, cyclic acetal or these acetals in which one or both oxygens are replaced by S. Specific examples of such compounds include tetratolyl borate, tetraphenyl borate, triphenyl cyano borate, tetra-2-naphthyl borate, phenyl-tri-1-naphthyl borate and vinyl-tri-1-naphthyl borate, etc.

The photographic elements of my invention are prepared by conventional techniques, a solution of the organo borate salt being whirl coated, dip coated, flow coated, hopper coated, etc. on any convenient support, the particular support chosen being dependent upon the end use of of the radiation sensitive coating. When resins, particularly those which are soluble in polar solvents, are applied in solution together with the radiation sensitive materials of this invention, there is obtained improved film formation, adhesion of the image to the support, etc.

Many of the organic compounds from which the organo borate salts useful in the practice of this invention are obtained, are radiation sensitive and are useful in various photographic elements. Usually these elements are negative working, i.e. the exposed areas are less soluble in the coating solvent (or other specified solvent) than the unexposed areas and may be developed in this solvent to leave the exposed areas as a possible resist or ink receptive area. On conversion of the compound to the organo borate salt and with incorporation of a sensitizer, the following usually occurs:

(1) the compound generally becomes positive working, at least when developed in aqueous or alcoholic solutions;
(2) the system becomes much less soluble in water and alcohol;
(3) its effective photographic speed is greatly increased and
(4) it is capable of being sensitized both with respect to speed and to spectral response whereas the compound or parent salt is usually incapable of such sensitization.

The concentrations of the coating solutions are dependent upon the nature of the radiation sensitive materials, the supports and the coating methods employed. In general, good coatings are obtained when the coating solutions contain ½ to 20 parts by weight, and preferably from 2 to 10 parts by weight of light sensitive material. Higher concentrations than 20 may also give satisfactory results.

In one embodiment of my invention, a tetra-substituted borate such as tetraphenyl borate, is reacted with an azonia diazo ketone. The resulting salt may be coated from any of various organic solvents preferably as 1 to 2% solutions and they may incorporate resinous binders from a mere trace up to 10 parts of binder to 1 part of azonia salt or complex. A print-out image is obtained by exposure to actinic radiation such as ultraviolet light.

The preparation of azonia diazo ketones is known in the art. The diol catechol derivatives may be prepared by the methods of Fields et al., J. Org. Chem., 30, 252 (1965). They may be further modified by the method of M. Cava, J. Am. Chem. Soc., 80, 2262 (1958). The use of these azonia diazo ketones in radiation sensitive coatings is disclosed in pending U.S. patent application Ser. No. 621,469, filed Mar. 8, 1967 in the names of Borden, Dunham, Fields and Miller. The preparation of tetraaryl borate compounds and their use for reaction with amines is summarized in the appendix to "The Organic Chemistry of Boron" by W. Gerrard, 1961, Academic Press, Wittig and Raff, "Annalen," 573, 195 (1951) also disclose the preparation of tetraaryl borates. The borate reactants employed in the practice of this invention and especially the coordination compounds with an "onium-ate" structure are described by G. Wittig, Ang. Chem., 70, 65 (1958) and by W. Tochtermann, Ang. Chem., Int. Ed., vol. 5 (1966), No. 4, pp. 351–366.

In another embodiment, a solution comprising at least one of the radiation sensitive materials of my invention is applied from solution to one of a variety of substrates, upon which it is desired to record an image. Such supports include lithographic supports, cloth, paper, ceramics, rubber, wood, metals, transparent plastic films and the like.

Various binders may be used, if desired, with the radiation sensitive material, although the radiation sensitive material may be used alone. Useful binders include film-forming resins such as phenyl formaldehyde resin including those known as novolak or resole resins.

It will be appreciated that the diazo compounds of this invention which are referred to herein may be reacted with couplers in the same manner as the diazo compounds which are unreacted with the borates described herein. However, the diazo compounds which have been reacted with the tetra-substituted borates can be sensitized to improve their sensitivity to actinic light. The reactivity of couplers with the reaction products of the tetra-substituted borates with diazo compounds is substantially the same as the reactivity with couplers of the diazo compounds which have not been reacted with the tetra-substituted borates. Accordingly, those couplers which are known in the art to be reactive with diazo compounds can also be used with the radiation sensitive diazo organo borate salts of my invention.

When photoresist compositions are provided according to my invention, they may be supplied in a dry form to be mixed with a suitable solvent. Solvent solutions may employ one or more volatile organic solvents which are solvents for both the radiation sensitive organo borate salt and any film forming resin incorporated in the photoresist composition.

In certain systems, an alkali soluble phenol formaldehyde resin is used which forms a reaction product with a radiation sensitive compound which is insoluble in alkali but which forms decomposition products, upon exposure to actinic rays, which are soluble in dilute alkali. The term "reaction product" used herein, is intended to include a complex or other association product.

In a particularly useful embodiment, the ratio of radiation sensitive material to resin is between 1:1.5 to 1:20 by weight and results in especially good performance at a ratio of 1:5 to 1:10 by weight. The amount of alkali and strength of alkali needed to process the exposed resist depends upon the ratio of radiation sensitive material to resin. The alkali solution may range in strength up to that equal to a 5% aqueous sodium hydroxide.

The radiation sensitive organo borate salts of my invention may be mixed or reacted with other radiation sensitive materials to increase the sensitivity to actinic rays or to enable the resulting radiation sensitive material to be spectrally sensitized. The term "other radiation sensitive materials" is used herein to include radiation sensitive compounds and/or resins which are not organo borate salts. For instance, the tetra-substituted borates may be reacted with diazo materials to provide compounds capable of being spectrally sensitized. My radiation sensitive materials may also be added to other radiation sensitive resins, such as radiation sensitive polycarbonates in any amount.

The solutions used for photoresists may be applied to a clean surface by spraying, dipping, whirling, etc. and air dried. If desired, a prebake of 10 to 15 minutes at 60° C. is given to remove residual solvent and the coating is exposed through a pattern to a lithographic source, such as a carbon arc.

Resist elements depend upon the solubilities of both the organo borate salt and of the resinous binder and the developer has to be carefully selected to dissolve the exposed areas if a positive resist is desired, or the unexposed areas if a negative resist is wanted. If the organo borate salt and sensitizer is incorporated in one of the acidic polymers mentioned above, a positive resist is usually obtained by developing the exposed element in a dilute alkaline solution such as 5–20 percent aqueous trisodium phosphate or ½–5 percent aqueous sodium hydroxide.

The alkaline strength of the developer, as well as the presence of addenda, such as solvents, is dependent on the particular radiation sensitive resin used, the film forming resin, if any, employed and the ratio of radiation sensitive material to resin. The developer may also contain dyes and hardening agents. The developed image is rinsed with distilled water and optionally postbaked for 15 to 30 minutes at 60 to 80° C. The substrate can then be etched by acid etching solutions, such as ferric chloride, etc.

In another embodiment of my invention, a solution containing at least one of the radiation sensitive materials of my invention is coated upon a lithographic support material by any convenient technique. The resulting photographic element is then exposed through a negative pattern to actinic radiation such as to standard carbon or mercury arcs used in exposing printing plates, or to other sources of ultraviolet light such as xenon arcs or high-pressure mercury vapor lamps. An advantage of the sensitized systems of this invention is that they may be exposed imagewise to tungsten and other incandescent sources not rich in the ultraviolet portion of the spectrum. Exposures can be made to heat lamps which emit very little radiation below 500 mμ. The time of exposure will vary with the particular borate and sensitizer being used and with the thickness of the coating, distance from source, emission spectrum of source and with any filters which may be present.

There may or may not be a visible image after exposure of an element consisting of a borate and sensitizer. In most cases, there is a bleach-out image, i.e. the highly colored element is bleached out in the exposed areas. In some cases there may be a print-out image, more highly colored, or of a different color than the unexposed element. Unlike the parent fluoroborate salts, the borate of many diazonium salts give a highly colored print-out image (often brownish or violet) against the yellow of the unexposed plates. This highly colored photodye is usually more soluble in aqueous and alcoholic processing solutions than the parent borate so the plates or elements are still positive working. This print-out image constitutes an advantage as it gives a clearly defined and contrasting image which may be evaluated before the element is developed.

One method of processing the exposed lithographic elements of this invention is to swab them with a cotton swab using a 10% solution of isopropanol in water, followed by application of a greasy lithographic ink. Some metal plates may be etched with a desensitizing etch before inking. In other cases, the ink-receptive coating may be decomposed by acid unless the greasy ink is applied first. Some plates are developable in water and methanol or other alcohols. They may be spray or tray-developed depending upon the particular coating, substrate, and thickness of coating. In some cases, treating the plate with an acidic etch makes it negative working while it is positive working if inked before etching. Some of the plates are positive working if developed in water or in very dilute solutions of alcohol in water but are negative working if developed in alcohol or in other organic solvents.

The lithographic support materials which are useful in this embodiment of my invention include those known in the art such as zinc, anodized aluminum, grained aluminum, copper and specially prepared metal and paper supports; superficially hydrolyzed cellulose ester films, polymeric supports such as polyolefins, polyesters, polyamides, etc.

The solvents which may be employed as coating solvents for the radiation sensitive materials of my invention are preferably organic solvents which may be selected from those which are capable of dissolving at least 0.2% by weight of the radiation sensitive materials employed but are unreactive toward the radiation sensitive materials and which are substantially incapable of attacking the substrates employed. Exemplary solvents include dimethyl formamide, dimethyl sulfoxide, 2-methoxyethanol, ketones such as 2-butanone, cyclohexanone, etc., acetonitrile, benzyl alcohol, benzene, toluene, xylene, 2-ethoxyethanol and mixtures of these solvents with each other or with one or more of the lower alcohols and ketones.

It will be appreciated by those skilled in the art that it can be advantageous to include in the coating solutions, materials which may serve to improve film formation, coating properties, adhesive of the coatings to the supports employed, mechanical strength, etc. Exemplary materials include resins, stabilizers and surface active agents. When resins are employed, they are usually selected from those which are soluble in both the coating and developing solvents, although minor proportions of resins which are insoluble in the development solvents may also be included. The amounts of resins soluble in both the coating and developing solvents which are employed will vary with the particular combination of resin and radiation sensitive material employed. In general, particularly useful results are obtained with coatings containing from 0.1 to 50 parts by weight of resin per part of radiation sensitive material.

The concentrations of the coating solutions are dependent upon the nature of the radiation sensitive materials, the supports and the coating methods employed. Particularly useful coatings are obtained when the coating solutions contain 0.05 to 3 parts by weight, and preferably from 0.5 to 2 parts by weight, of radiation sensitive material. Higher concentrations than 3%, of course, give satisfactory results.

As pointed out above, phenol formaldehyde resins are particularly useful for incorporation in radiation sensitive coatings containing the azonia diazo ketone defined herein. These phenol formaldehyde resins include those which have been described as novolak and resole resins. ("Hackh's Chemical Dictionary" by Grant, 3rd edition, 1944, McGraw-Hill, New York, N.Y.)

The novolak resins are prepared by the condensation of phenols and aldehyde under acidic conditions. Less than 6 moles of formaldehyde are used per 7 moles of phenol to provide products which are permanently fusible and soluble. In a typical synthesis, novolaks are prepared by heating 1 mole of phenol with 0.5 mole of formaldehyde under acidic conditions. The temperatures at which the reaction is conducted are generally from about 25° C. to about 175° C.

The novolak resins are prepared by the condensation of phenol with formaldehyde, more generally by the reaction of a phenolic compound having two or three reactive aromatic ring hydrogen positions with an aldehyde or aldehyde-liberating compound capable of undergoing phenol-aldehyde condensation. Illustrative of particularly useful phenolic compounds are cresol, xylenol, ethylphenol, butylphenol, isopropylmethoxyphenol, chlorophenol, resorcinol, hydroquinone, naphthol, 2,2-bis(p-hydroxyphenol) propane and the like.

The resole resins are similar except that they are prepared under basic conditions.

Illustrative of especially efficacious aldehydes are formaldehyde, acetaldehyde, acrolein, crotonaldehyde, furfural, and the like. Illustrative of aldehyde-liberating compounds are 1,3,5-trioxane, etc. Ketones such as acetone are also capable of condensing with the phenolic compounds.

The most suitable novolak resins are those which are insoluble in water and trichloroethylene but readily soluble in conventional organic solvents such as methyl ethyl ketone, acetone, methanol, ethanol, etc. Novolak resins having a particularly desirable combination of properties are those which have an average molecular weight in the range between about 350 and 40,000.

It is to be understood that the term novolak resins as used herein, indicates those resins which can be incorporated with the radiation sensitive polymers; those novolak resins which can be used are those which are either heat fusible or solvent soluble, which permit admixture and association.

Specific examples of salts useful in the practice of my invention are given in Table I and in the illustrative examples. These examples are included for illustrative purposes only, with no intent to limit the invention to the methods and materials described.

TABLE I

A Diazonium salts:

| | | |
|---|---|---|
| 1 | 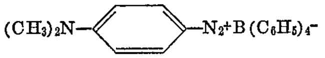 | p-Dimethylaminobenzenediazonium tetraphenylborate. |
| 2 | 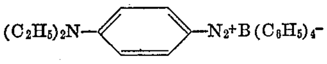 | p-Diethylaminobenzenediazonium tetraphenylborate. |
| 3 | 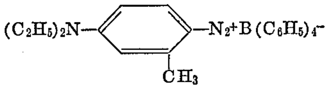 | 4-diethylamino-2-methylbenzene-diazonium tetraphenylborate. |
| 4 | 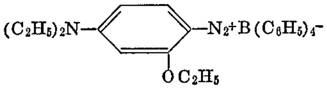 | 4-diethylamino-2-ethoxybenzene-diazonium tetraphenylborate. |
| 5 | 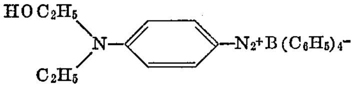 | 4-(N-hydroxyethyl-N-ethyl)benzenediazonium tetraphenylborate. |
| 6 | 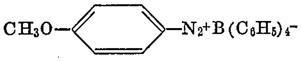 | 4-methoxybenzenediazonium tetraphenylborate. |
| 7 | 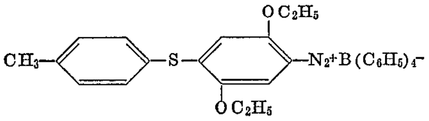 | 4-p-tolylmercapto-2,5-diethoxybenzenediazonium tetraphenylborate. |
| 8 | 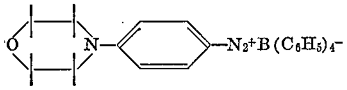 | 4-morpholinobenzenediazonium tetraphenylborate. |
| 9 | 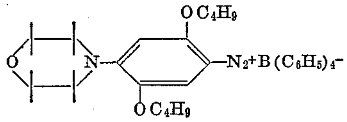 | 4-morpholino-2,5-dibutoxybenzenediazonium tetraphenylborate. |
| 10 | 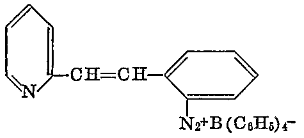 | 2'-(2-styrylpyridine)diazonium tetraphenylborate. |
| 11 | 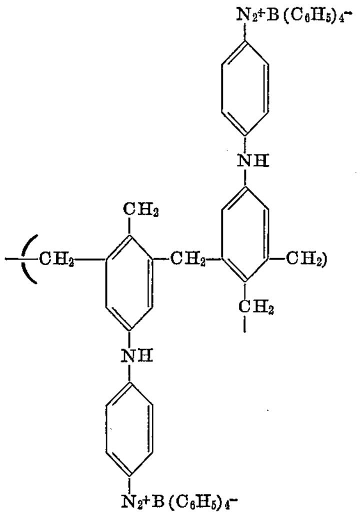 | p-Diazodiphenylamine-formaldehyde resin tetraphenylborate. |

TABLE I—Continued

| | | |
|---|---|---|
| B | Azonia diazoketones: | |
| 1---- | 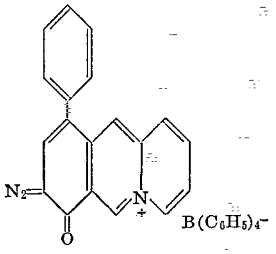 | 8-phenyl-6-diazo-5-oxo-4a-azoniaanthracene tetraphenylborate. |
| C | Quaternary salts bearing azides: | |
| 1---- | 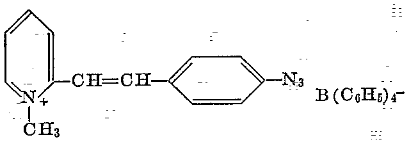 | 4′-azido-1-methyl-2-styrylpyridinium tetraphenylborate. |
| 2---- | 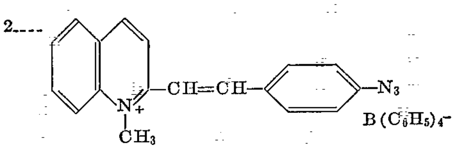 | 4′-azido-1-methyl-2-styrylquinolinium tetraphenylborate. |
| 3---- | 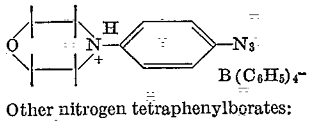 | 1-(4-azidophenyl)morpholinium tetraphenylborate. |
| D | Other nitrogen tetraphenylborates: | |
| 1---- | 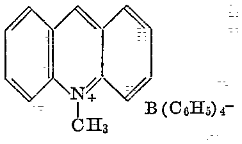 | 10-methylacridinium tetraphenylborate. |
| 2---- | 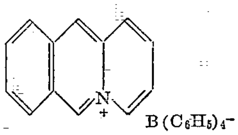 | 10a-acridizinium tetraphenylborate. |
| 3---- | 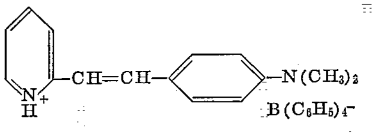 | 4′-dimethylamino-2-styrylpyridinium tetraphenylborate. |
| 4---- | 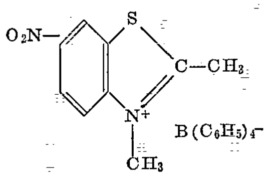 | 2,3-dimethyl-6-nitrobenzothiazolium tetraphenylborate. |
| 5---- | 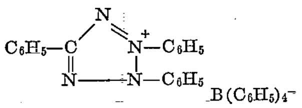 | 2,3,5-triphenyl-2H-tetrazolium tetraphenylborate. |
| 6---- | 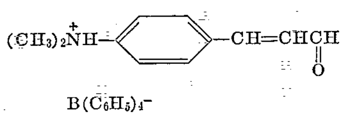 | 4-dimethylaminocinnamaldehyde tetraphenylborate. |
| 7---- | 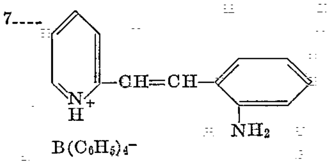 | 2′-amino-2-styrylpyridinium tetraphenylborate. |

TABLE I—Continued

8.... 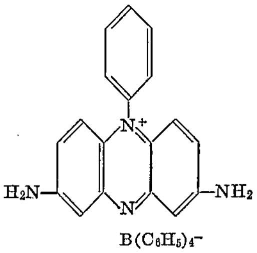

Phenosafranin tetraphenylborate.

9.... 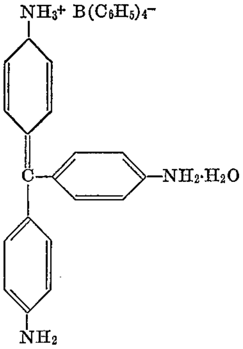

p-Rosaniline tetraphenylborate.

10... 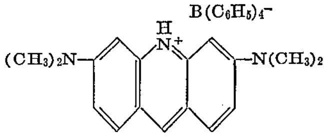

Acridine orange tetraphenylborate.

11... 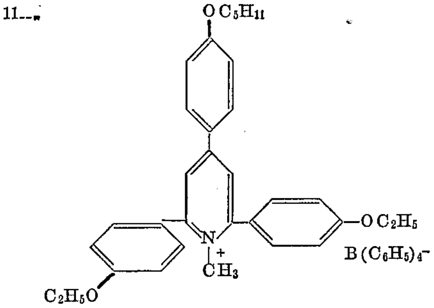

1-methyl-2,6-di(4-ethoxyphenyl)-4-(4-n-amyloxyphenyl)-pyridinium tetraphenylborate.

12... 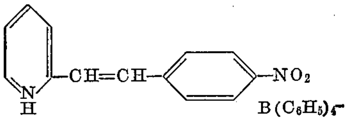

4'-nitro-2-styrylpyridinium tetraphenylborate.

E Other "Onium" tetraphenylborates:

1.... $(C_6H_5)_4As^+B(C_6H_5)_4^-$ — Tetraphenylarsonium tetraphenylborate.

2.... $[(NH_3)_6Co]^{+++}[B(C_6H_5)_4]_3^-$ — Hexamine cobaltic tetraphenylborate.

3.... $[(C_5H_5)_2Ti]^{++}[B(C_6H_5)_4]_2^-$ — Dicyclopentadienyl titanium tetraphenylborate.

4.... $[(NH_3)_4Pd]^{++}[B(C_6H_5)_4]_2^-$ — Tetramine palladium tetraphenylborate.

5.... $[(C_4H_9)_3P]_4Pd^{++}[B(C_6H_5)_4]_2^-$ — Tetra(tributylphosphine) palladium tetraphenylborate.

6.... 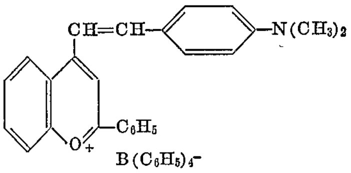

4-(4-dimethylaminostyryl)-flavilium tetraphenylborate.

7.... 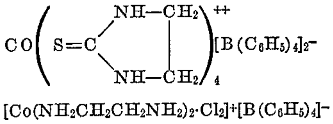

Tetra(2-thioimidazolidone) cobalt tetraphenylborate.

8.... $[Co(NH_2CH_2CH_2NH_2)_2\cdot Cl_2]^+[B(C_6H_5)_4]^-$ — Cobalt di(ethylenediamine)-dichloro tetraphenylborate.

| | | |
|---|---|---|
| 9 | 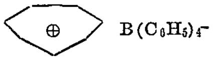 | Tropylium tetraphenylborate: |
| 10 | 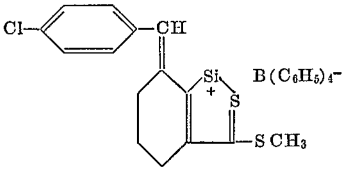 | 7-(4-chlorobenzylidene)-3-methyl thio-4,5,6,7-tetrahydrobenzo[b]-1,2-dithiolium tetraphenylborate: |
| 11 | 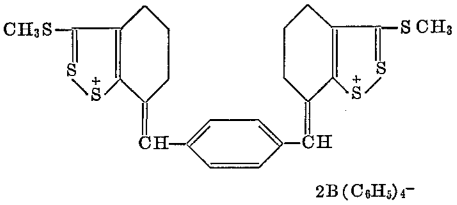 | 7,7'-p-phenylenedimethylidynebis [3-methylthio-4,5,6,7-tetrahydro-benzo[b]-1,2-dithiolium tetraphenyl borate]. |
| 12 | 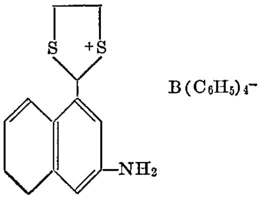 | 2-(3-aminonaphthalene-1)-4,5-dihydro-1,3-dithiolium tetraphenylborate. |
| 13 | 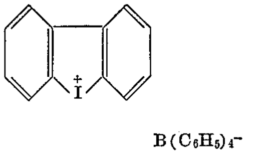 | Diphenyleneiodonium tetraphenylborate. |
| 14 | 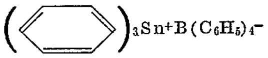 | Triphenyl tin tetraphenylborate: |
| 15 | 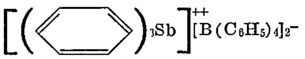 | Triphenyl stibine tetraphenylborate. |
| 16 | $[(NH_3)_6Cr]^{+++}[B(C_6H_5)_4]_3^-$ | Hexamine chromic tetraphenylborate. |
| 17 | $[(H_2NCH_2CH_2NH_2)_3Cr]^{+++}[B(C_6H_5)_4]_3^-$ | Ethylenediamine chromic tetraphenylborate. |
| 18 | 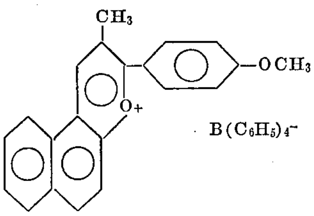 | 2-methyl-3-(4-methoxyphenyl)-naphtho[2,1-b]pyryliumtetraphenylborate. |

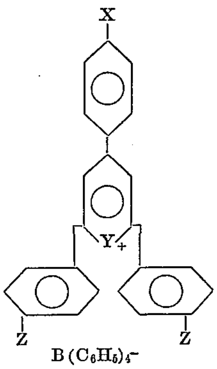

←

| X | Y | Z |
|---|---|---|
| (19) —Cl | O | —H |
| (20) —Cl | S | —H |
| (21) —I | O | —H |
| (22) —I | S | —H |
| (23) —N(CH$_3$)$_2$ | S | —H |
| (24) —SCH$_3$ | O | —H |
| (25) —OH | O | —OH |
| (26) —H | S | —H |

| | | |
|---|---|---|
| 19 | Same as above | 2,6-diphenyl-4-(4-chlorophenyl)-pyrylium tetraphenyl borate. |
| 20 | do | 2,6-diphenyl-4-(4-chlorophenyl) thiapyrylium tetraphenyl borate. |
| 21 | do | 2,6-diphenyl-4-(4-iodophenyl)pyrylium tetraphenyl borate. |
| 22 | do | 2,6-diphenyl-4-(4-iodophenyl)thiapyrylium tetraphenyl borate. |

TABLE I—Continued

| | | |
|---|---|---|
| 23 | do | 2,6-diphenyl-4-(4-dimethylamino-phenyl)thiapyrylium tetraphenyl borate. |
| 24 | do | 2,6-diphenyl-4-(4-methylthiophenyl) pyrylium tetraphenyl borate. |
| 25 | do | 2,4,6-tri (4-hydroxyphenyl)-pyrylium tetraphenyl borate. |
| 26 | do | 2,4,6-triphenylthiapyrylium tetraphenyl borate. |
| 27 | 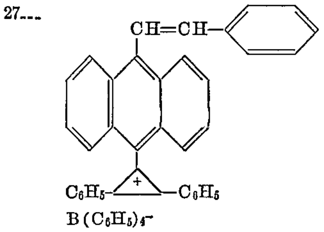 | Diphenyl(10-styrylanthryl-9)cyclopropylium tetraphenyl borate. |
| 28 | 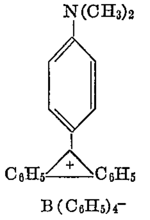 | Diphenyl(4-dimethylaminophenyl)-cyclopropylium tetraphenyl borate. |

Representative salts include:

(1) alkyl-2(4)-styrylpyridinium salts and their vinylogs
(2) 1-alkyl-2(4)-(2-furylvinyl)pyridinium salts and their vinylogs
(3) N-vinylpyridinium salts
(4) N-styrylpyridinium salts
(5) polymethinebis[2(4)-pyridinium salts]
(6) alkylenebis(styrylpyridinium salts)
(7) 2,2′-azobispyridinium salts
(8) 4,4′-azobispyridinium salts
(9) cycloammonium salts bearing an azido group
(10) salts of 4-dialkylaminostilbenes
(11) salts of 4-dialkylaminophenylacrylonitriles
(12) salts of 4-dialkylaminocinnamaldehydes
(13) salts of glutaconaldehyde dianil
(14) vinyl polymers having appended stilbazolium salt groups
(15) azoniaanthracinium salts
(16) azoniaanthracinium diazo ketone salts
(17) pyridinium salts
(18) quinolinium salts
(19) benzothiazolium salts
(20) salts of 4-dimethylaminobenzal anilines
(21) poly(vinyl pyridinium salts)
(22) phosphonium salts
(23) dithiolium salts
(24) pyrylium salts
(25) thiapyrylium salts
(26) metallocene salts
(27) dipyridyl salts
(28) 4,4′-bis(dimethylamino)benzophenone salts
(29) 4-hydrazinoquinaldine salts
(30) p-rosaniline salts
(31) poly(1-vinyloxycarbonylmethylene pyridinium salts)
(32) crotyl triphenyl phosphonium chloride
(33) 2,4,6-triphenylpyrylium tetrafluoroborate
(34) diphenyleneiodonium bisulfate
(35) 2,6-bis(p-ethoxyphenyl) - 4 - (p-n-amyloxyphenyl) thiapyrylium perchlorate The compounds useful as sensitizers in the practice of this invention are any spectral sensitizers as exemplified by the classes set forth in Table II. As some of the sensitizers are dyes, the classification is based on the classification of dyes described in Gilman, "Organic Chemistry," vol. III, pp. 246–391, John Wiley and Son, New York, 1953. Also on the classification of dyes described in Venkataraman, "Synthetic Dyes," vol. I, Chapter 5, pp. 241–7.

As many of these compounds are organic intermediates rather than dyes, other broad classes are included based on one or more of the functional groups in the sensitizer. Many of the sensitizers have several functional groups and may be classified in more than one class. Representative examples of compounds from the various classes which have been shown to be effective sensitizers in the practice of this invention are illustrated in Table II. Other sensitizers include representatives of the above classes which are effective sensitizers in other non-silver photographic applications such as the sensitization of photopolymers or of photopolymerization or of organic photoconductors. The sensitizers may be incorporated in the coating solutions in amounts ranging from 1 to 100 parts of sensitizer per 100 parts of the organo borate salt. A particularly useful range is between 1:10 and 1:50 parts of sensitizer to parts of organo borate salt by weight.

TABLE II

Example of sensitizers which are particularly effective with organo borate salts (I) Acridines:
  (a) Acridine orange
  (b) N-Phenylacridone
  (c) N-Phenylthioacridone
(II) Anthrones:
  (a) 9-diazo-10-phenanthrone
(III) Azines:
  (a) p-Dimethylaminocinnamalazine
  (b) Benzo[a]phenothiazine
  (c) Benzo[b]phenoxazine
(IV) Azo dyes (and hydrazo compounds):
  (a) Orange II
  (b) Hydrazobenzene
(V) Azomethine:
  (a) 3,3′-diethyl-4-methylthiocarbocyanine bromide
(VI) Polycyclic hydrocarbons:
  (a) 5,6,11,12-tetraphenylnaphthacene
(VII) Diphenylmethane dyes:
  (a) Auramine "O"
  (b) N-(o-chlorophenyl)leucauramine
(VIII) Halogen compounds:
  (a) 2,4,6-tri(tribromomethyl)-s-triazine (also classified under triazine reactive dyes—(IX)(f) below)
(IX) Heterocyclic compounds such as:
  (a) 1 - methyl - 2-benzoylmethylene-$\beta$-naphthothiazoline (b) Methyl - 3 - methyl-2-benzothiazolidene dithioacetic acid
(c) 4-quinolizone
(d) 4-thioquinolizone
(e) 1,2-diazaaceanthone
(f) 2,4,6-tri(tribromomethyl)-s-triazine (X) Inorganic sensitizers:
(a) Phosphotungstic acid
(b) Phosphomolybdic acid
(c) Chromic acetate
(d) Ceric ammonium nitrate
(e) Chromous chloride (XI) Ketones:
(a) 4,4'-bis(dimethylamino)benzophenone
(b) 4,4'-bis(dimethylamino)thiobenzophenone
(c) 2,3-diphenylindenone (XII) Methine:
(a) 4-(flavan-4-ylmethylene)flavilium perchlorate
(b) 2,6 - bis(4 - β - hydroxyethoxybenzylidene)-4-methylcyclohexanone
(c) 1,1-dicyano-2-methyl-4-phenyl-1,3-butadiene
(d) 2-styrylbenzo[b]pyrylium perchlorate
(e) 2,5-difurfuryl cyclopentanone (XIII) Nitro:
(a) 5-nitroacenaphthenone
(b) 2,6-dichloro-4-nitroaniline
(c) 2,4,6-tri(4-nitrophenyl)pyrylium perchlorate (XIV) Organometallic sensitizers:
(a) Dicyclopentadienyl titanium dichloride
(b) Dicyclopentadienyl iron
(c) Cupric(picoline - 1-oxide)$_6$ perchlorate$_2$ or hexapicoline-1-oxide cupric perchlorate (XV) Oxanol dyes:
(a) 2,6-diphenyl-4-thionathiapyrone
(b) 6-diethylamino-4-methylcoumarin (XVI) Pyrylium dyes:
(a) 2,4,6-triphenylpyrylium fluoroborate
(b) 2,4,6-triphenylthiapyrylium fluoroborate
(c) 2,6 - di(4-ethylphenyl)-4-(4-n-amyloxyphenyl)-thiapyrylium perchlorate
(d) 2,6 - di(4 - ethoxyphenyl)-4-(4-n-amyloxyphenyl)-thiapyrylium perchlorate (XVII) Quinones:
(a) 2-methylanthraquinone (XVIII) Quinoneimines:
(a) p-Rosaniline hydrochloride (XIX) Sulfur dyes:
(a) N,N-dicyclohexyl dithiooxamide (XX) Triphenylmethane dyes:
(a) Methyl violet
(b) Basic fuchsin (XXI) Xanthene dyes:
(a) Eosin
(b) Erythrosin
(c) Rhodamine B
(d) 4',5'-diiodofluorescein
(e) Fluorescein
(f) Rose bengal In the following illustrative examples, the speed is determined by a procedure similar to that of E. M. Robertson, J. Appl. Pol. Sci. II, 302–311 (1959). The speed is relative to a standard coating of poly(vinyl cinnamate). In addition to the coatings processed in the standard technique of Robertson using xenon and carbon arcs, certain samples were evaluated by exposing them through a series of Wratten filters which transmit various portions of the spectrum from 290 mμ to 700 mμ. The exposures were made in a machine having a belt speed of 2–5 feet/minute. At 2 feet/minute, the actual exposure time is about one minute. However, some of the tetraphenyl borate and sensitizer systems are completely exposed on this source with a belt speed of 30 feet/minute, or with an exposure time of a few seconds.

Unless the exposure and processing differs considerably, all the following examples were treated as described above. The borates are all as listed in Table I and the sensitizers as in Table II.

EXAMPLE 1 p-Dimethylaminobenzenediazonium tetraphenyl borate (A1)

A solution of 23.5 g. (0.10 mole) of p-dimethylaminobenzenediazonium fluoroborate (M.P. 149°) in 200 ml. of methanol and 100 ml. of water and a solution of 34.2 g. (0.10 mole) of sodium tetraphenyl boron in 100 ml. of methanol was mixed and immediately, the yellow tetraphenyl borate precipitates. After filtering and washing in water and in methanol, the product is dried in a vacuum desiccator at room temperature. The yield is 43.0 g. (92%). M.P. 113–4° d. $\lambda_{max}$ 377 mμ ($\epsilon$=45,000).

*Analysis.*—Calcd. for $C_{32}H_{30}BN_3$ (percent): C, 82.2; H, 6.5; B, 2.3; N, 9.0. Found (percent): C, 82.5; H, 6.4; B, 2.5; N, 9.0.

Whirl coatings are made on grained aluminum of 3% of (A1) in dimethylformamide and exposed to an ultraviolet light pattern. The plates are swab-developed with methanol, then with a desensitizing etch and then with a greasy lithographic ink. All are positive working.

EXAMPLE 2 p-Dimethylaminobenzenediazonium tetraphenyl borate (A1)

Whirl coatings are made on grained aluminum of 3% of (A1) in dimethylformamide and sensitizers as listed in Table II. The sensitizer:diazonium salt ratio is either 1:10 or 1:20 as specified below. Exposures, development and sensitometric measurements are made as described above. These coatings clearly demonstrate the broad range of sensitizers effective either with respect to speed or to spectral response (or both) in elements using the diazonium tetraphenyl borate. These plates are all swab-developed with methanol, then with a desensitizing etch, and then with a greasy lithographic ink. All are positive working except those marked with an asterisk which are negative working due to the solubility effects of some of the sensitizers and the fact that some of them probably exchange anions with the diazonium tetraphenyl borate as the coated elements dry.

| | Sensitizer/diazo ratio | Visible image | Litho image | Speed | Spectral sensitizer, mμ |
|---|---|---|---|---|---|
| Sensitizer: | | | | | |
| None | 0:1 | Print-out | Positive | 50 | 260–440 |
| Ia | 1:20 | Bleach-out | Negative | 350 | 280–540 |
| Ib | 1:20 | Print-out | Positive | 350 | 280–500 |
| Ic | 1:20 | do | do | 350 | 280–520 |
| IIa | 1:20 | do | do | 350 | 280–480 |
| IIIa | 1:20 | Bleach-out | do | 450 | 300–580 |
| IIIb | 1:20 | Print-out | do | 450 | 290–550 |
| IIIc | 1:20 | do | do | 110 | 290–530 |
| IVa | 1:20 | Bleach-out | do | 180 | 290–480 |
| IVb | 1:20 | Print-out | do | 350 | 280–440 |
| Va | 1:20 | Bleach-out | do | 50 | 290–530 |
| VIa | 1:20 | do | do | 110 | 290–500 |
| VIIa | 1:20 | do | do | 450 | 280–500 |
| VIIb | 1:20 | do | do | 250 | 280–520 |
| VIIIa | 1:20 | Print-out | do | 450 | 290–500 |
| IXa | 1:10 | do | do | 200 | 290–500 |
| IXb | 1:10 | do | do | 300 | 280–500 |
| IXc | 1:10 | do | do | 100 | 280–460 |
| IXd | 1:10 | do | do | 300 | 280–490 |
| IXe | 1:20 | do | do | 350 | 280–490 |
| Xa | 1:20 | do | Negative | 80 | 300–470 |
| Xb | 1:20 | do | do | 250 | 280–540 |
| Xc | 1:20 | do | Positive | 45 | 280–450 |
| Xd | 1:20 | do | do | 80 | 280–480 |
| Xe | 1:20 | Bleach-out | do | 80 | 280–480 |
| XIa | 1:10 | Print-out | do | 300 | 290–460 |
| XIb | 1:20 | Bleach-out | do | 110 | 280–540 |
| XIc | 1:20 | Print-out | do | 250 | 280–480 |
| XIIa | 1:20 | do | do | 70 | 280–530 |
| XIIb | 1:20 | do | do | 30 | 280–520 |
| XIIc | 1:20 | do | do | 100 | 280–450 |
| XIId | 1:20 | do | do | 100 | 280–500 |
| XIIIa | 1:20 | do | do | 70 | 280–530 |
| XIIIb | 1:20 | do | do | 120 | 280–450 |
| XIIIc | 1:20 | do | do | 90 | 280–550 |
| XIVa | 1:10 | Bleach-out | do | 100 | 280–430 |

TABLE—Continued

| | Sensitizer/diazo ratio | Visible image | Litho image | Speed | Spectral sensitizer, mμ |
|---|---|---|---|---|---|
| XIVb | 1:20 | Bleachout | Positive | 110 | 280-500 |
| XIVc | 1:20 | do | Negative | 180 | 280-440 |
| XVa | 1:10 | Print-out | Positive | 300 | 280-490 |
| XVb | 1:20 | do | do | 350 | 290-480 |
| XVIa | 1:10 | do | do | 300 | 290-470 |
| XVIb | 1:20 | Bleach-out | do | 80 | 280-500 |
| XVIc | 1:10 | do | do | 150 | 290-500 |
| XVId | 1:10 | do | do | 400 | 290-560 |
| XVIe | 1:10 | do | do | 150 | 290-600 |
| XVIIa | 1:10 | Print-out | do | 200 | 280-480 |
| XVIIIa | 1:10 | Bleach-out | do | 30 | 280-540 |
| XIXa | 1:20 | do | do | 350 | 290-440 |
| XXa | 1:20 | do | do | 80 | 290-440 |
| XXIa | 1:10 | do | do | 50 | 290-460 |
| XXIb | 1:10 | do | do | 50 | 290-450 |
| XXIc | 1:10 | do | do | 150 | 290-450 |
| XXId | 1:10 | do | do | 100 | 290-500 |

EXAMPLE 3

Tetraphenylarsonium tetraphenyl borate $(C_6H_5)_4$ as $B(C_6H_5)_4$ (E1)

Tetraphenylarsonium tetraphenyl borate is prepared by reacting the chloride with excess sodium tetraphenyl boron in water. The white tetraphenyl borate precipitates and is filtered and dried. M.P. 292–6° C. Sample coatings of 3% in dimethyl formamide (DMF) of the tetraphenyl borate and 0.3% sensitizer are made on grained aluminum plates. These plates are exposed to a quartz resonance lamp (90% emission at 2537 A.) using an aluminum step tablet on fused silica as the test pattern. The plates are swab developed with 10% aqueous trisodium phosphate, then with 10% aqueous isopropanol, with a desensitizing etch and with a greasy lithographic ink. They are positive working and the portions are not destroyed by light accepted ink. Sensitizer IXd and XVId both show an increase of 1.5–2.0 times in effective speed. A pattern consisting of black paper strips taped directly on the aluminum strips similarly exposed with no intervening glass or film base clearly shows effective sensitization in the rate of photodecomposition of the tetraphenyl borate by sensitizers IXd and XVId.

EXAMPLE 4

10-methylacridinium tetraphenyl borate (D1). $\lambda_{max}$ 340, 347, 348 mμ

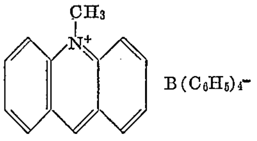

The orange, water-insoluble tetraphenyl borate was prepared from the chloride. M.P. 194–5° C. Coated as in the previous example and exposed through a series of Wratten filters as described above, the coatings are developed by swabbing with 10% aqueous isopropanol, followed by a desensitizing etch and a greasy lithographic ink. They are all positive working and produce excellent images when a line a half-tone positive transparency is used in the exposure. The following table lists the sensitizer (from Table II), the relative speeds with the control as 1.5[1], and the spectral extension compared with a control of 400 mμ.

| | Speed[1] | Spectral extension, mμ |
|---|---|---|
| Sensitizer: | | |
| Unsensitized control | 1.5 | 280-400 |
| IXa | 6.0 | 280-530 |
| IXb | 6.0 | 280-530 |
| IXc | 6.0 | 280-490 |
| IXd | 4.0 | 280-530 |
| XVIIa | 3.0 | 280-460 |
| XIIe | 4.0 | 280-460 |
| XVIb | 5.0 | 280-430 |
| XVId | 4.0 | 280-550 |
| XIb | 4.0 | 280-620 |

[1] Number of 0.15 density steps solubilized by a 1-minute exposure to a 1,200-watt high-pressure mercury lamp.

EXAMPLE 5

Acridizinium tetraphenyl borate (D2). $\lambda_{max}$ 352, 370, 399 mμ

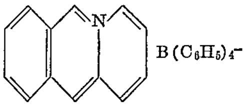

In order to compare the effectiveness of sensitization of the tetraphenyl borate of a quaternized bridgehead nitrogen with that of a quaternized perinitrogen on a related compound, the tetraphenyl borate was prepared from 10a-acridizinium bromide in 96% yield by reaction with sodium tetraphenyl boron in water-methanol solution. M.P. 262–5° C. Coated and exposed as in Example 4, the avridizinium salt is somewhat less light sensitive than the acridinium salt. The sensitometry is given below as in Example 4.

| | Number steps solubilized | Spectral extension, mμ |
|---|---|---|
| Sensitizer: | | |
| Control | 0.5 | 280-400 |
| IXa | 3.0 | 280-530 |
| IXb | 6.0 | 280-530 |
| IXc | 3.0 | 280-400 |
| IXd | 2.0 | 280-420 |
| XVIIa | 6.0 | 280-400 |
| XIIe | 0.5 | 280-400 |
| XVIb | 3.5 | 280-430 |
| XVId | 2.0 | 280-540 |
| XIb | 2.0 | 280-550 |
| XXIb | 4.0 | 280-600 |

EXAMPLE 6

8-phenyl-6-diazo-4-oxo-4a-azonia-anthracene tetraphenyl borate (B1)

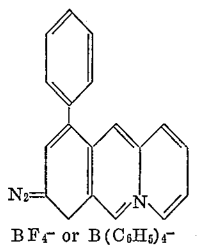

A comparison is made of the sensitization of an azonia diazo ketone both as the parent fluoroborate and as the tetraphenyl borate, by coating both of them with a series of sensitizers (Table II) on grained aluminum. The coating solutions consist of 2% of the azonia compound and 0.2% sensitizer in dimethylformamide. The coatings of the fluoroborate are exposed through 0.15 density step tablets and through a series of Wratten filters at 2 feet/minute on a machine as described in previous examples. They are developed in hot water and the data is read from the steps which print out. The photoproducts are alcohol soluble and it is not practical to ink the plates. Some of the sensitizers give colored photoproducts so the results in some cases might be the sum of two independent photoreactions rather than sensitization of one by the other.

The water insoluble tetraphenyl borate is prepared by adding sodium tetraphenyl boron to a solution of the fluoroborate in dimethylformamide and coating the product without isolating it. With no polymeric binder, it can be used to make an excellent negative working lithographic system if developed in methanol. The sensitometric coatings of the tetraphenyl borate are exposed half as long as the coatings of the fluoroborate and the steps read are those insolubilized, developed and inked.

| | Fluoroborate at 2 ft./min. | | Tetraphenyl borate at 4 ft./min. | |
|---|---|---|---|---|
| | Steps printed out | Spectral extension to, mμ | Steps insoluble | Spectral extension to, mμ |
| Sensitizer: | | | | |
| Control | 3.0 | 530 | 8.0 | 470 |
| IXb | 4.0 | 550 | 6.0 | 530 |
| IXc | 3.0 | 530 | 7.0 | 530 |
| IXd | 3.0 | 530 | 7.5 | 500 |
| XIb | 5.0 | 530 | 9.0 | 600 |
| XVId | 4.0 | 530 | 5.7 | 550 |
| XVIIa | 4.0 | 530 | 8.5 | 470 |
| XXIb | 5.0 | 600 | 8.0 | 550 |
| XXIc | 3.0 | 560 | 6.1 | 560 |

EXAMPLE 7

Diazonium tetraphenyl borates

The diazonium tetraphenyl borates of compounds listed in part (a) of Table I are all made similarly to that described in Example 1. The parent salts are either fluoroborates or zinc chloride double salts. All are positive working and can be sensitized as in Example 2. In order to compare the photochemical behavior of a diazonium tetraphenyl borate with that of the fluoroborate, both the tetraphenyl borate and the fluoroborate of (A1) are dissolved in dimethyl sulfoxide and coupled immediately upon addition of 2,4-diphenyl-6-methylpyrylium perchlorate to for a greenish dye. When coated on paper or on aluminum, both dyes bleach out on exposure to light, although the tetraphenyl borate reacts faster. When the two salts are mixed 2,3-dihydroxynaphthalene and coated on paper and exposed, both give a pale violet print out image in the exposed areas and when the papers are exposed to aqueous ammonia, the unexposed areas couple off to form a deep violet dye characteristic of a diazo system. In this case, the fluoroborate reacts faster because the tetraphenyl borate is much less soluble in water. These show that the tetraphenyl borate will couple under both basic and acidic conditions. A coating of the same tetraphenyl borate in a poly(vinyl butyral) resin gives the violet print out on exposure to light and insolubilization of the polymer in the exposed areas. In this respect, it behaves similarly to the other diazonium salts.

EXAMPLE 8

Quaternized nitrogen tetraphenyl borates bearing an azide group

A solution of 3.64 g. (0.01 mole) of 4′-azido-1-methyl-2-styrylpyridinium iodide in 110 ml. of methanol, 20 ml. of water, and 20 ml. of acetonitrile is added to a solution of 3.42 g. (0.01 mole) of sodium tetraphenyl boron in 40 ml. of methanol and 10 ml. of water. A heavy orange precipitate forms immediately. This is washed with water, filtered and dried to yield 5.23 g. (94%) (Cl). M.P. 165–6° C.

A solution of 3% of (Cl) in dimethylformamide is whirl coated on grained aluminum plates. Sensitizers are added to other coatings at 0.3% in the coating solution. These coatings are exposed and evaluated as in Example 2. They are developed in methanol, etched with a desensitizing etch and inked with a greasy ink. All the coatings are negative working as the photo products in these cases are less soluble in the processing solution than the unexposed areas. However, it is apparent that these azide-bearing salts are capable of both speed and spectral sensitization when converted to the tretraphenyl borates in the practice of this invention. The fact that these and some of the other tetraphenyl borates are negative working instead of the usual positive working systems does not prevent their being sensitized.

| | Speed | Spectral extension to, mμ |
|---|---|---|
| Sensitizer: | | |
| Control | 250 | 450 |
| IXa | 1,000 | 490 |
| IXb | 1,410 | 530 |
| IXc | 447 | 470 |
| IXd | 710 | 530 |
| XVId | 250 | 500 |
| XVIIa | 790 | 500 |

The tetraphenyl borate of 4′-azido-1-methyl-2-styrylquinolinium iodide is prepared and is found to be particularly effective as a negative working lithographic material.

EXAMPLE 9

Diazonium resin (All)

A 3% solution of the resin from p-diazodiphenylamine and formaldehyde as the fluoroborate is prepared in dimethyl sulfoxide containing 10% water. Some of the solution is whirl coated on grained aluminum as a control (A). An excess of sodium tetraphenyl boron is added to the remaining solution and the mixture is warmed gently. A sample of this solution gives a precipitate when poured into water indicating conversion of the resin to the tetraphenyl borate. Samples of this solution are similarly whirl coated on aluminum with no sensitizer and with 0.3% of a few of the sensitizers listed in Table II. All plates are exposed for ten seconds to a 1200-watt high pressure mercury lamp under a positive transparency and also under a series of Wratten filters. Plate (A) is negative working if developed with water or with 1:1 water and methanol followed by treatment with an acidic desensitizing etch and a greasy lithographic ink. Plate (B) and the other tetraphenyl borate coatings are all positive working if developed with methanol and negative working if developed with acetone. They can likewise be treated with an acidic etch and inked up to give lithographic plates. The tetraphenyl borate plates all show about 1.5 times the speed of the fluoroborate plate. All the sensitized tetraphenyl borate plates show spectral sensitization. The extent of spectral sensitization is shown below:

| | Sensitizer | Spectral sensitizer, mμ | Remarks |
|---|---|---|---|
| Plate: | | | |
| (A) | None | 290–440 | Fluoroborate. |
| (B) | do | 290–440 | Tetraphenyl borate. |
| (C) | XVId | 290–550 | Do. |
| (D) | IXd | 290–520 | Do. |
| (E) | XXIb | 290–570 | Do. |

This example shows that the diazonium resins can be effectively sensitized to the visible spectrum by conversion to the tetraphenyl borate. It is also possible to use the tetraphenyl borate resin as either a positive or a negative working lithographic system.

EXAMPLE 10

Hexamine cobaltic tetraphenyl borate
(E2) $[(NH_3)_6Co]^{+++}[B(C_6H_5]_4^-$M.P. 116–7° C.

A solution of 2.0 g. (0.0076 mole) of hexamine cobaltic chloride in 100 ml. of water is added to a solution of 7.7 g. (0.25 mole of sodium tetraphenyl boron in 30 ml. of water. A bright orange material precipitates and after filtering and washing in water it is dried to yield 6.6 g. (89%) of the tetraphenyl borate. (E2). This material, when coated on grained aluminum, exposed, and then developed in 10% aqueous isopropanol then with an acidic desensitizing etch and a greasy lithographic ink, gives excellent negative working lithographic plates. Coatings of 3% of this tetraphenyl borate and 0.3% sensitizer are made on grained aluminum from dimethylformamide. These are exposed for 1 minute to a 1200-watt type high pressure mercury lamp using a 0.15 density gradient step tablet and a series of Wratten filters as a pattern. The plates are developed as described above and the sensitometric data are summarized below.

| | Sensitizer | Steps insoluble | Spectral sensitizer, mμ |
|---|---|---|---|
| Plate: | | | |
| (A) | None | 0.5 | 290–430 |
| (B) | IXa | 5.0 | 290–450 |
| (C) | XIb | 4.0 | 290–600 |
| (D) | IXb | 5.0 | 290–450 |
| (E) | IXc | 5.0 | 290–440 |
| (F) | IXd | 3.0 | 290–450 |
| (G) | XIIe | 6.0 | 290–450 |
| (H) | XVIIa | 1.0 | 290–400 |
| (I) | XVIb | 9.0 | 290–550 |

EXAMPLE 11

The following table summarizes coatings made from each of the tetraphenyl borates listed in Table I as being useful in the practice of this invention. Whether they are positive or negative working depends upon the relative solubilities of the unexposed and the exposed areas to the particular solvent system being used in development. Most are positive working. A few are only negative working and some may be developed to give either positive or negative plates if the development is as specified.

The various developer solutions are described below:

(a) 10% isopropanol in water
(b) methanol
(c) desensitizing etch (gum-free)
(d) water
(e) acetone
(f) rub-up ink (such as Sinclair and Valentine Sol. No. 50)
(g) 10% isopropanol, 10% methanol, 80% water
(h) 10% aqueous trisodium phosphate

TABLE III

| Compound | Positive | Negative |
|---|---|---|
| (A) Diazonium salts: | | |
| 1 | b, c, f | |
| 2 | b. c. f | |
| 3 | b, f | a, f |
| 4 | b, c, f | |
| 5 | b, c, f | a, c, f |
| 6 | b, f | |
| 7 | b, f | |
| 8 | | a, c, f |
| 9 | a, f | |
| 10 | c, f | d, f |
| 11 | b, c,f | e, b, c, f |
| (B) Azonia diazoketones: | | |
| 1 | | a, c, f |
| (C) Quaternary nitrogen salts bearing azides: | | |
| 1 | | b, c, f |
| 2 | | b, c, f |
| 3 | | c, f |

TABLE III—Continued

| Compound | Positive | Negative |
|---|---|---|
| (D) Nitrogen tetraphenyl borates: | | |
| 1 | a, c, f | |
| 2 | b, c, f | |
| 3 | b, c, f | |
| 4 | | b, c, f |
| 5 | a, c, f | |
| 6 | | a, c, f |
| 7 | | a, d, f |
| 8 | | a, f, c |
| 9 | a, f, c | |
| 10 | | a, f, c |
| 11 | b, c, f | a, f |
| 12 | b, f | b, c, f |
| (E) Other "Onium" tetraphenyl borates: | | |
| 1 | h, a, c, f | |
| 2 | | a, c, f |
| 3 | b, c, f | |
| 4 | | a, c, f |
| 5 | a, c, f | |
| 6 | a, f | |
| 7 | | a,f |
| 8 | a, f, c | |
| 9 | b, c, f | |
| 10 | d, f | |
| 11 | d, f | |
| 12 | d, f | |
| 13 | a, c, f | |
| 14 | a, c, f | |
| 15 | a, c, f | |
| 16 | | g, f, c |
| 17 | | g, f, c |
| 18 | a, f, c | |
| 19 | a, f | |
| 20 | a, f, c | |
| 21 | a, f | |
| 22 | a, f, c | |
| 23 | d, f | |
| 24 | a, f, c | |
| 25 | a, f, c | |
| 26 | c, f | |
| 27 | a, f | |
| 28 | a, f | |

EXAMPLE 12 p-Dimethylaminobenzene diazonium tetratolyl borate

The tetratolyl borate is prepared by reacting equivalent amounts of p-dimethylaminobenzene diazonium fluoroborate with lithium tetratolyl boron in 20% aqueous methanol. The yellow precipitate of the tetratolyl borate is filtered and washed and dried. (M.P. 98° d.)

Whirl coatings are made of 3% of the diazonium tetratolyl borate in dimethylformamide on grained aluminum plates. A few coatings are made with sensitizers added at 0.3% to the coating solutions. These are described in Table II. These coatings are exposed on a machine at three feet/minute. All of them form bleach out images in the exposed areas. If swab developed with 10% isopropanol in water, then with a desensitizing etch and then with a greasy rub-up ink, they are all positive working but if hot water is used followed by the ink and then the etch, negative working plates result. The spectral sensitivity of the plates is extended as follows: Control (to 440 mμ), IIIa (to 550 mμ), XIb (to 540 mμ) and XXIb (to 630 mμ).

The tetratolyl borate in this case is more soluble in alcohol than the tetraphenyl borate. It may be developed to give either positive or negative lithographic images.

EXAMPLE 13 p-Dimethylaminobenzene diazonium triphenylcyano borate

The triphenylcyano borate is prepared by reacting equivalent amounts of p-dimethylaminobenzene diazonium fluoroborate with sodium triphenylcyano boron in 20% methanol in water. The yellow product is filtered, washed and dried. (M.P. 135° d.)

Coatings are made on aluminum from dimethylformamide as described in Example 12. Ordinarily, the resulting plates are positive working but if overexposed, they become negative working. In certain cases where the coatings are exposed through a series of Wratten filters, the exposed areas through effective filters are negative and those through marginally effective filters are positive. The peak sensitivity of this salt is about 370 mμ so exposures are also made using tungsten incandescent lamps with little ultraviolet emission. This combined with Wratten filters which transmit only a band of the visible spectrum shows clearly the effective spectral sensitization which exposures to sources rich in ultraviolet would not show. The table below shows the effectiveness of each sensitizer through the various Wratten filters as determined by an inked lithographic image. The number of (+)'s indicates the relative intensity of the image. Where (−)'s are used, the images are negative working. All are swabbed with isopropanol a desensitizing etch and a greasy rub-up ink.

The fluorescein dyes appear to be generally effective as spectral sensitizers with this diazonium triphenylcyano borate. Both the tetratolyl and the triphenylcyano borates of this salt are less stable thermally and photographically than the tetraphenyl borate. Both salts are more soluble in alcohol and are more readily hydrolyzed and decomposed in acid than the tetraphenyl borate.

TABLE IV.—SPECTRAL SENSITIZATION OF p-DIMETHYLAMINOBENZENE DIAZONIUM TRIPHENYLCYANO BORATE

| | See Table 2, sensitizer | Wratten filter number: Transmits >510 mμ, 15 | 470–620 mu, 58 | 360–540 mu, 47 | 290–510 >600 mu, 32 | >560 mu, 23A | Image | Litho |
|---|---|---|---|---|---|---|---|---|
| Coating: | | | | | | | | |
| A | None | ---------- | ---------- | +++ | +++ | ---------- | ---------- | P/N* |
| B | IIIa | ++ | ++ | +++ | +++ | + | BO* | P/N |
| C | IXb | ++ | +++ | − − | − − | ---------- | PO* | P/N |
| D | XIb | + | + | +++ | − − − | + | PO | P/N |
| E | XVIIIb | + | + | ++ | − − − | ---------- | BO | P/N |
| F | XXIa | ++ | ++ | +++ | − − − | ---------- | BO | P/N |
| G | XXIb | +++ | +++ | +++ | +++ | + | BO | P |
| H | XXIc | +++ | +++ | +++ | − − − | ++ | PO | P/N |
| I | XXIe | ++ | ---------- | + − | − − − | ---------- | ---------- | P/N |
| J | XXIf | + | ---------- | +++ | +++ | + | BO | P/N |

NOTE:
P/N=Positive-working and negative-working.
BO=Bleach-out.
PO=Print-out.

EXAMPLE 14

To a solution of 1.42 g. (0.005 mole) of β,β'-p-phenylenebis-(2-vinylpyridine) in 40 ml. of dimethylformamide at 100° C. is added an excess of 5% aqueous hydrochloric acid to form the dihydrochloride of the base after which a solution of 3.4 g. (0.01 mole) of sodium tetraphenyl borate in 20 ml. of water is added to precipitate the corresponding orange tetraphenyl borate which is then collected on a filter.

A 3% solution of the tetraphenyl borate salt in dimethylformamide is whirl coated on a grained aluminum plate and the dried coating is exposed through a half-tone negative for 5 minutes to a General Electric RS Sunlamp at a distance of 10 inches. Swab development of the exposed plate with 5% aqueous trisodium phosphate followed by treatment with an acidic desensitizing etch and a lithographic ink gives an excellent positive plate suitable for use on an offset press.

EXAMPLE 15

2,2'-azopyridine is quaternized with ethylenebis(oxymethylene chloride) and the resulting salt is converted to the corresponding tetraphenyl borate in the same manner as is the dihydrochloride in Example 14. A coating of the tetraphenyl borate on grained aluminum prepared, exposed and processed in the same manner as the coating in Example 14 gives an excellent positive lithographic plate.

EXAMPLE 16

5,6-dihydroxy-4a-azoniaanthracene perchlorate, prepared by the method of Fields et al., J. Org. Chem., 30, 252 (1965), is oxidized with aqueous nitric acid to 5,6-dioxo-4a-azoniaanthracene nitrate which is converted to the corresponding tetraphenyl borate by the method described in Example 14.

A 3% solution of the resulting tetraphenyl borate in dimethylformamide is whirl coated on a grained aluminum plate and the dried coating is exposed through a half-tone negative for 5 minutes to a General Electric RS Sunlamp at a distance of 10 inches. Swab development of the exposed plate with 5% aqueous trisodium phosphate followed by treatment with an acidic desensitizing etch and a lithographic ink gives an excellent positive lithographic plate.

A similar coating of the parent 5,6-dioxo-4a-azonia-anthracene perchlorate, exposed and processed in the same manner, also gives a positive lithographic plate but the image has less ink receptivity.

EXAMPLE 17

5,6-dihydroxy-8-phenyl-4a-azoniaanthrancene bromide, prepared by the method of Fields et al., J. Org. Chem., 30, 252 (1965), is oxidized with aqueous nitric acid to 8-phenyl-4a-azoniaanthracene-5,6-dione nitrate.

A mixture of 8-phenyl-4a-azoniaanthracene-5,6-dione nitrate (34.8 g.) and p-toluenesulfonylhydrazide (25 g.) is dissolved in 100 ml. of methanol which has been saturated with hydrogen chloride. After standing at autogenous temperature for 15 minutes, the red solution is diluted with 200 ml. of water and 50 ml. of fluoroboric acid to obtain 6-diazo-5-oxo-8-phenyl-4a-azoniaanthracene tetrafluoroborate as a yellow crystalline product which is collected after refrigeration of the mixture for 2 hours at −20° C.

A 3% solution of 6-diazo-5-oxo-8-phenyl-4a-azoniaanthracene tetrafluoroborate in dimethylformamide is treated with an equivalent of sodium tetraphenyl borate at 50° C. for about 5 minutes and the resulting solution is coated on a grained aluminum plate by means of a plate whirler. The coated plate, after drying, is exposed and processed in the same manner as that in Example 16 to obtain a positive lithographic plate.

EXAMPLE 18

A solution of 0.5 g. of poly(vinyl chloroacetate) and 1.0 g. of 4'-methoxy-4-stilbazole in 20 g. of dimethylformamide is heated at 75° C. for 15 minutes and the resulting solution is then dropped into diethyl ether to precipitate the polymeric product. A sample of the polymeric product is dissolved in dimethylformamide and treated with an equivalent amount of sodium tetraphenylborate and the resulting solution is coated on a grained aluminum plate. The resulting coating is exposed and processed in the same manner as the coatings in the above examples to obtain a positive lithographic image.

A coating prepared from the parent quaternized polymer which has not been treated with sodium tetraphenyl borate also affords a negative working lithographic plate but the positive image obtained is less ink receptive.

EXAMPLE 19

A 3% solution of triphenyl phosphonium-2-p-nitrophenylazocyclopentadienylide in dimethylformamide is treated with an equivalent of concentrated hydrochloric acid and an equivalent of sodium tetraphenyl borate and the resulting solution is whirl coated on a grained aluminum plate. The dried plate is then exposed through a photographic negative for 10 minutes to a General Electric RS Sunlamp at a distance of 10 inches, developed in 5% aqueous trisodium phosphate, treated with an acidic desensitizing etch, lacquered and inked to obtain a positive lithographic image.

EXAMPLE 20

A coating composition prepared by reacting a 3% solution of titanocene dichloride in dimethylformamide with an excess of sodium tetraphenyl borate at 50° C. is coated on a grained aluminum plate and dried. The coating is then exposed through a half-tone negative for 10 minutes to a General Electric RS Sunlamp at 10 inches, developed with an acidic desensitizing etch and inked to produce a negative lithographic image.

A similar coating of cobaltocene tetrephenyl borate exposed in the same manner, developed in water and inked, also gives a negative lithographic image.

EXAMPLE 21

A 3% solution of 4-(4-methylphenyl)-1,2-dithiolium hydrogen sulfate in dimethylformamide is reacted with an excess of sodium tetraphenyl borate in the presence of a trace of hydrochloric acid. The resulting solution is coated on a grained aluminum plate and the dried coating exposed through a half-tone negative for 10 minutes to a General Electric RS Sunlamp at a distance of 10 inches, developed in water and inked to give a positive lithographic image.

EXAMPLE 22

A 2% solution in dimethylformamide of 1,4-xylylene-bis(4'-methoxy-4-styrylpyridinium bromide) is reacted with an excess of sodium tetraphenyl borate by heating briefly to 40° C. with stirring. The tetraphenyl borate formed is not isolated prior to coating but a sample of the reaction mixture gives a yellow precipitate when poured into water. The reaction mixture is while coated onto a grained aluminum plate and the dried plate is then exposed through a positive transparency to a General Electric RS Sunlamp at a distance of 10 inches for 4 minutes. The exposed plate is developed in dilute aqueous trisodium phosphate and then in water. It is then treated with an acidic desensitizing etch and inked with a lithographic ink to give a good positive lithographic plate. The spectral sensitivity of the plate extended from 300–470 m$\mu$.

EXAMPLE 23

A 2% solution of 2,5-diethoxy-4-(p-tolylmercapto)-benzene diazonium chloride zinc chloride in dimethylformamide is whirl coated on a grained aluminum plate. Exposure for 5 minutes through a positive transparency to a General Electric RS Sunlamp at a distance of 10 inches and development in dilute aqueous trisodium phosphate gives a good negative image.

To a 2% solution of the same diazonium salt in dimethylformamide is added an excess of sodium tetraphenyl borate and the mixture is then heated briefly at 40° C. A coating of the resulting solution on a grained aluminum plate gives an excellent positive image when exposed and developed in the same manner as the parent diazonium salt coating above. The image obtained accepts lithographic ink and is suitable for lithographic use.

EXAMPLE 24

A 3% solution of Rhodamine B in dimethylformamide is reacted with an excess of sodium tetraphenyl borate in the usual fashion and the reaction mixture is whirl coated on a grained aluminum plate. The dried coating, when exposed to a General Electric RS Sunlamp in the usual fashion through positive transparency, gives a positive bleach-out image. Development of the plate in dilute aqueous trisodium phosphate, treatment with a desensitizing etch, and inking with a lithographic ink, gives an excellent positive lithographic plate.

A 2% solution of Rhodamine B tetraphenyl borate in a mixture of acetone and acetonitrile is coated on a polyvinyl alcohol-titanium dioxide sized paper support to obtain an excellent presensitized positive working lithographic plate which gives excellent images when exposed and developed as above.

EXAMPLE 25

A solution of 5,6-dihydroxy-4a-azoniaanthracene bromide (18.7 g. 0.06 mole) and N-isobutoxymethylpiperazine (10 g. 0.04 mole) in 200 ml. of aqueous 50% acetic acid is heated at 80° C. for 5 minutes, diluted with 150 ml. of water and then refrigerated for 1 hour at −5° C. The resulting red crystals (13.8 g.) are collected, washed with water and oxidized with 50% nitric acid to obtain 8,8'-methylenebis-(5,6-dioxo - 4a - azoniaanthracene nitrate). The latter is then treated with p-toluenesulfonylhydrazide, in the presence of hydrogen chloride, and then with fluoroboric acid in the manner described in Example 17 to obtain 9.4 g. of 8,8'-methylenebis-(6-diazo-5-oxo-4a-azoniaanthracene tetrafluoroborate).

A mixture of 0.04 mole of 8,8'-methylenebis-(6-diazo-5-oxo-4a-azoniaanthracene tetrafluoroborate) and 20 g. of cyclopentadiene in 400 ml. of 1:1 nitromethane-acetonitrile is allowed to stand at room temperatore for 30 minutes and then diluted with diethyl ether to precipitate 8,8'-methylenebis-(6-diazo-5-oxo-5,6,9,10 - tetrahydro-4a-azonia-9,10-cyclopent - 14 - enoanthracene tetrafluoroborate), (I wherein $X=BF_4$).

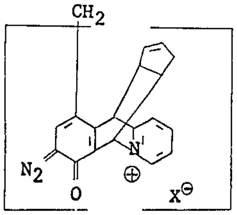

(I)

A solution of 2.5 g. (0.007 mole) of sodium tetraphenyl borate in 20 ml. of acetonitrile is added to a solution of 2.75 g. (0.007 mole) of I, wherein $X=BF_4$, in 30 ml. of acetonitrile and the mixture is heated briefly at about 35° C. The solution is then poured into diethyl ether and the precipitated yellow tetraphenyl borate of I is collected and dried.

A 2% solution of the tetraphenyl borate of I in dimethylformamide is whirl coated on a grained aluminum plate and allowed to dry. The plate is then exposed for 2 minutes through a positive pattern to a General Electric RS Sunlamp at a distance of 10 inches, developed in 5% aqueous trisodium phosphate, rinsed in water, treated with an acidic desensitizing etch and inked with lithographic ink to obtain a positive reproduction of the positive original suitable for lithographic use.

EXAMPLE 26

A coating solution (II) is prepared from 6.5 ml. of a 10% solution of the tetrafluoroborate of I in dimethylformamide and 5 ml. of a 10% solution of sodium tetraphenyl borate in dimethylformamide and the following coatings are prepared:

(a) II and 11.5 ml. of dimethylformamide on gravure copper
(b) II and 11.5 ml. of 2% cellulose acetate hydrogen phthalate in cyclohexanone on gravure copper
(c) II on gravure copper
(d) II and 11.5 ml. of 2% ethyl cellulose phthalate in cyclohexanone on gravure copper
(e) II and 11.5 ml. of 2% phthalated polyvinyl acetal in 2-ethoxy ethanol on gravure copper (f) II on zincated aluminum
(g) II and 11.5 ml. of 2% ethyl cellulose phthalate in cyclohexanone on zincated aluminum
(h) II and 11.5 ml. of 2% cellulose acetate hydrogen phthalate in cyclohexanone on zincated aluminum
(i) II and 6.25 ml. of a 2% solution of a 4:1 copolymer of ethyl acrylate and acrylic acid in 2-butanone and 6.25 ml. of dimethylformamide on gravure copper
(j) II and 5.8 ml. of a 5% solution of a novolak in cyclohexanone and 5.7 ml. of dimethylformamide on gravure copper
(k) II and 11.5 ml. of 2% phthalated poly(vinyl acetal) in 2-ethoxyethanol on zincated aluminum
(l) II and 6.25 ml. of a 2% solution of a 4:1 copolymer of ethyl acrylate and acrylic acid in 2-butanone on zincated aluminum
(m) II and 5.8 ml. of a 5% solution of a novolak in cyclohexanone and 5.7 ml. of dimethylformamide on zincated aluminum The resulting plates are exposed for 3 minutes through a positive transparency to a General Electric RS Sunlamp at a distance of 10 inches and developed in dilute alkali to obtain positive images which are then tested for resistance to 42° Bé. ferric chloride etchant. In resistance to the etchant, the copper plates obtained from (b) is best, standing 10 minutes etching with only slight resist breakdown. The remaining copper plates are rated as follows in descending order of resistance to the etchant: *i, j, d, c, e* and *a*. The zincated aluminum plates all give positive resist images but are not deep etched by the etchant.

EXAMPLE 27

Three percent solutions in dimethylsulfoxide of 2,6-diphenyl-4-(4-iodophenyl)pyrylium perchlorate and 2,6-diphenyl - 4 - (4 - iodophenyl)thiapyrylium perchlorate are each whirl coated on grained aluminum plates. Samples of these perchlorates are also converted to the corresponding tetraphenyl borates by adding an excess of sodium tetraphenyl borate to their solutions (3%) in dimethylsulfoxide and warming gently. The resulting solutions are also coated on grained aluminum plates. The four plates thus obtained are each exposed for 20 seconds to a 1200 watt, high pressure mercury lamp through a positive pattern. Neither of the coatings of the perchlorates give a visible image, but when they are carefully swab developed with 10% aqueous isopropanol and then with a lithographic ink, weak negative images are obtained. On the other hand, both of the tetraphenyl borate coated plates give bleach-out images and form excellent ink-receptive, positive images when processed sequentially with 10% aqueous isopropanol, a desensitizing etch and a lithographic ink.

EXAMPLE 28

Three percent solutions of diphenyl iodonium bisulfate, triphenyl tin chloride and triphenyl stibine dichloride in dimethylsulfoxide are each converted to the corresponding tetraphenyl borate solutions by treatment with an excess of sodium tetraphenyl borate followed by gentle heating. The resulting solutions are whirl coated on grained aluminum plates, dried and the plates are each exposed for 10 minutes through a positive pattern to a quartz resonance lamp having 90% emission at 2537 A. Swab development of the exposed plates with 10% aqueous isopropanol followed by treatment with a desensitizing etch and a lithographic ink gives positive images suitable for lithography.

EXAMPLE 29

To a solution of 0.5 g. of butadienyl triphenyl phosphonium perchlorate in 10 ml. of methanol is added an excess of sodium tetraphenyl borate. The white precipitate of the tetraphenyl borate is collected and then redissolved to obtain a 3% solution in dimethylformamide. This solution is whirl coated on a grained aluminum plate and exposed for 10 minutes to a General Electric RS Sunlamp at a distance of 10 inches using a positive line transparency as a pattern. No visible image results but when the plate is swab developed with either methanol or with an acidic etch, a positive image is formed which could be inked up with a lithographic ink to obtain a positive lithographic plate.

EXAMPLE 30

The above examples wherein tetraphenyl borates are used are repeated by substituting in each example the borates disclosed in Table I, columns 9 through 18. Similar results are obtained.

The invention has been described in detail with particular reference to preferred embodiments thereof, but it will be understood that variations and modifications can be effected within the spirit and scope of the invention as described hereinabove and as defined in the appended claims.

I claim:

1. A radiation sensitive element comprising a support having thereon a radiation sensitive organo borate salt having the structural formula:

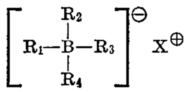

wherein $R_1$ is an aryl radical; each of $R_2$, $R_3$, and $R_4$ is selected from the group consisting of aryl, lower alkyl, aralkyl, cyano and lower alkenyl radicals; any two of the $R_1$, $R_2$, $R_3$, and $R_4$ radicals taken together can represent an arylene radical; and $X^{\oplus}$ is an organic cation containing an atom selected from the group consisting of nitrogen, arsenic, tin, antimony, sulfur, iodine, phosphorus, oxygen, titanium, palladium, chromium, and cobalt.

2. An element of claim 1 wherein $R_1$, $R_2$, $R_3$, and $R_4$ are each aryl radicals.

3. An element of claim 2 wherein $R_1$, $R_2$, $R_3$ and $R_4$ are each phenyl radicals.

4. An element of claim 1 wherein the organic cation is a radiation sensitive organic cation.

5. An element of claim 2 wherein the organo borate salt is a diazotetraaryl borate.

6. An element of claim 2 wherein the organo borate salt is an azonia diazo ketone tetraaryl borate.

7. An element of claim 1 wherein the support is a metallic support.

8. An element of claim 1 wherein the support is an aluminum support.

9. A radiation sensitive element comprising a support bearing a layer of a radiation sensitive diazo tetraphenyl borate.

10. An element of claim 9 wherein the radiation sensitive compound is p-dimethylaminobenzenediazonium tetraphenyl borate.

11. A radiation sensitive element comprising a support bearing a layer of a radiation sensitive azonia diazo ketone tetraphenyl borate.

12. An element of claim 11 wherein the radiation sensitive compound is 8 - phenyl-6-diazo-5-oxo-4a-azonia-anthracene tetraphenyl borate.

References Cited

UNITED STATES PATENTS 3,155,513 11/1964 Sorensen ------------ 96—49X

WILLIAM D. MARTIN, Primary Examiner

T. G. DAVIS, Assistant Examiner

U.S. Cl. X.R.

96—75, 86

UNITED STATES PATENT OFFICE
CERTIFICATE OF CORRECTION

Patent No. 3,567,453 Dated March 2, 1971

Inventor(s) Douglas G. Borden

It is certified that error appears in the above-identified paten and that said Letters Patent are hereby corrected as shown below:

Column 22, lines 60 to 69, (Example 6) should appear a shown below:

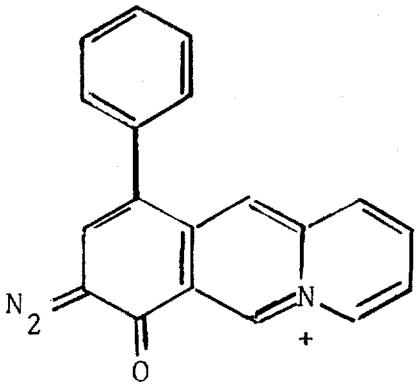

$BF_4^-$ or $B(C_6H_5)_4^-$

Signed and sealed this 16th day of November 1971.

(SEAL)
Attest:

EDWARD M.FLETCHER,JR.
Attesting Officer

ROBERT GOTTSCHALK
Acting Commissioner of Pa